(12) United States Patent  
Maekawa

(10) Patent No.: US 8,445,901 B2  
(45) Date of Patent: May 21, 2013

(54) MANUFACTURING METHOD OF SEMICONDUCTOR DEVICE

(75) Inventor: Shinji Maekawa, Shizuoka (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 13/463,276

(22) Filed: May 3, 2012

(65) Prior Publication Data

US 2012/0211737 A1    Aug. 23, 2012

Related U.S. Application Data

(60) Continuation of application No. 12/761,426, filed on Apr. 16, 2010, now Pat. No. 8,227,294, which is a division of application No. 10/573,328, filed as application No. PCT/JP2005/015963 on Aug. 25, 2005, now Pat. No. 7,732,248.

(30) Foreign Application Priority Data

Aug. 31, 2004    (JP) .................................. 2004-251926

(51) Int. Cl.
*H01L 35/24*    (2006.01)

(52) U.S. Cl.
USPC ........... 257/40; 257/59; 257/72; 257/E51.001

(58) Field of Classification Search
USPC ................. 257/40, 59, 72, E51.001
See application file for complete search history.

(56) References Cited

U.S. PATENT DOCUMENTS

| | | |
|---|---|---|
| 6,278,127 B1 | 8/2001 | Dodabalapur et al. |
| 6,740,900 B2 | 5/2004 | Hirai |
| 6,833,327 B2 | 12/2004 | Ishikawa |
| 6,842,657 B1 | 1/2005 | Drzaic et al. |
| 6,885,146 B2 | 4/2005 | Yamazaki et al. |
| 7,342,245 B2 | 3/2008 | Tanabe |
| 7,378,791 B2 | 5/2008 | Yamazaki et al. |
| 2003/0160235 A1 | 8/2003 | Hirai |
| 2005/0095772 A1 | 5/2005 | Ishikawa |
| 2008/0248609 A1 | 10/2008 | Yamazaki et al. |
| 2010/0129528 A1 | 5/2010 | Yamazaki et al. |

FOREIGN PATENT DOCUMENTS

| | | |
|---|---|---|
| CN | 1445596 | 10/2003 |
| JP | 01-108527 | 4/1989 |
| JP | 07-221367 | 8/1995 |
| JP | 2000-066233 | 3/2000 |

(Continued)

OTHER PUBLICATIONS

Kawasaki. M., et al., "A High-Resolution Active-Matrix Liquid Crystal Display With Organic Thin-Film Transistors", AM-LCD 04 Digest of Technical Papers, 2004, OLED-L1, pp. 25-26.

(Continued)

*Primary Examiner* — Anthony Ho
(74) *Attorney, Agent, or Firm* — Nixon Peabody LLP; Jeffrey L. Costellia

(57) ABSTRACT

In view of the problem that an organic semiconductor layer of an organic TFT is likely to deteriorate due to water, light, oxygen, or the like, it is an object of the present invention to simplify a manufacturing step and to provide a method for manufacturing a semiconductor device having an organic TFT with high reliability. According to the invention, a semiconductor layer containing an organic material is formed by patterning using a mask, and thus an organic TFT is completed in the state where the mask is not removed but to remain over the semiconductor layer. In addition, a semiconductor layer can be protected from deterioration due to water, light, oxygen, or the like by using the remaining mask.

31 Claims, 14 Drawing Sheets

FOREIGN PATENT DOCUMENTS

| | | |
|---|---|---|
| JP | 2003-525521 | 8/2003 |
| JP | 2003-258164 | 9/2003 |
| JP | 2003-324202 | 11/2003 |
| JP | 2004-152958 | 5/2004 |
| JP | 2006-041317 | 2/2006 |
| WO | WO-01/08241 A1 | 2/2001 |

OTHER PUBLICATIONS

Chinese Office Action (Application No. 201010197639.5; PCTCN08133D1) Dated Mar. 15, 2011.

"Office Action (Application No. 200580028621.X;PCTCNO8133) Dated Oct. 23, 2009 ,".

Machine Translation of JP 07-221367.

Machine Translation of JP 2000-066233.

"Improvement of a Short-Channel Bottom-Contact Pentacene OTFT and Its Application to an AM-LCD", AM-LCD 04 Digest of Technical Papers, 2004, OLED-2, pp. 1-4.

Written Opinion of the International Searching Authority dated Dec. 6, 2005.

International Search Report for PCT/JP2005/015963 dated Dec. 6, 2005.

Office Action dated Jul. 4, 2008 in Chinese Patent Application No. 200580028621,X; PCTCN8133, with English Translation.

MANUFACTURING METHOD OF SEMICONDUCTOR DEVICE

TECHNICAL FIELD

The present invention relates to a semiconductor device having an organic thin film transistor and a manufacturing method thereof.

BACKGROUND ART

Nowadays, a technique for making up a thin film transistor (TFT) with a semiconductor thin film (thickness of approximately from several nanometers to several hundred nanometers) formed over a substrate having an insulating surface attracts attention. A thin film transistor is widely applied to an electronic device such as an IC and an electro-optic device. In particular, a thin film transistor has been rushed to be developed as a switching element of a display device.

The study of a thin film transistor using an organic semiconductor (hereinafter, referred to as "organic TFT") among TFTs is proceeding. An organic TFT has good flexibility since an organic material is used. In addition, an organic TFT can be formed at lower temperature compared with a TFT using an inorganic semiconductor; therefore, a resin material such as plastic can be used for a substrate. As a result, a device which is lightweight and flexible can be obtained. An organic TFT is not only able to be expected to simplify a process by using a printing method, an ink-jet method, a vapor deposition method, and the like but able to suppress a manufacturing cost since an inexpensive material for a substrate can be used; therefore, it can be estimated that there is an advantage in respect of costs.

An organic TFT has a disadvantage that deterioration of an electric characteristic is caused if an organic TFT is left in an atmospheric air since an organic semiconductor is oxidized or decomposed by being exposed to water or oxygen. Therefore, as in Patent Document 1 (Patent Document 1: Patent Laid-Open No. 2003-324202), an insulating film is formed over a semiconductor layer of an organic TFT to protect the semiconductor layer by the insulating film to reduce the deterioration due to water, light, or oxygen.

DISCLOSURE OF INVENTION

However, one manufacturing step is added to manufacturing steps of a TFT when an insulating film for covering a semiconductor layer of an organic TFT is formed.

Further, also in the case of forming a plurality of organic TFTs having different conductivity over the same substrate, a semiconductor film formed in advance is required to be covered with an insulating film or the like so that the semiconductor film of an organic TFT having one type of conductivity formed in advance is not etched along with patterning of a semiconductor film having the other type of conductivity formed afterward. Therefore, a step of forming an insulating film newly over the semiconductor film formed in advance is required.

On the other hand, in the case of forming an organic semiconductor layer by patterning, there is a step of removing a mask which is used for the patterning. In general, a mask is formed of an organic insulating film such as polyvinyl; therefore, the mask is removed by wet etching. After removing the mask, the surface of an organic semiconductor layer is washed to wash away etchant remaining over the surface of the organic semiconductor layer. Hence, it is highly likely that water penetrates into the organic semiconductor layer in this step; therefore, the step is not favorable for the organic semiconductor layer. The mask material and the organic semiconductor layer material are organic materials; therefore, it is difficult to obtain large selectivity between the organic semiconductor material and the mask when the mask is removed. It is required to select materials for the organic semiconductor and the mask in order to obtain large selectivity; therefore, there is a limitation in selecting a material.

SUMMARY OF THE INVENTION

In view of the foregoing problems, it is an object of the present invention to simplify a manufacturing step. Moreover, it is an object of the invention to provide a method for manufacturing a semiconductor device having an organic TFT with high reliability.

One feature of the invention is that a semiconductor layer containing an organic material is formed by patterning using a mask to complete a TFT in the state where the mask is not removed to remain over the semiconductor layer. One feature of the invention is to protect the semiconductor layer from deterioration due to water, light, oxygen, or the like using the remaining mask.

One feature of the invention is that a semiconductor layer having one type of conductivity is formed by patterning using a mask when P type and N type organic TFTs are formed over the same substrate, then a semiconductor layer having the other type of conductivity is formed by patterning using a mask with the mask remaining over the semiconductor layer. That is, one feature of the invention is to complete each organic TFT with a mask remaining over each semiconductor layer.

One feature of the invention is to form a mask which is to be formed over a semiconductor layer by a method which gives the lower semiconductor layer less physical damage, such as a droplet discharge method. One feature of the invention is to provide a barrier layer formed of an inorganic film between a remaining mask and a semiconductor layer containing an organic material. Note that a droplet discharge method in this specification is a method for forming a film using an ink jet device or a dispenser device.

According to the invention, a manufacturing step can be simplified and an organic TFT can be prevented from deterioration due to water, light, or oxygen, and thus an organic TFT with high reliability can be obtained. Further, the problem on selectivity of etchant in a step of removing a mask is not required to be considered since the mask is not removed, and thus the material of an organic semiconductor and a mask can be freely selected.

Wet etching which is frequently used for removing a mask and washing of the surface of an organic semiconductor layer after etching can be omitted since there is no step of removing a mask. Hence, a step in which water is likely to penetrate into an organic semiconductor layer most can be omitted, and this is greatly effective for preventing an organic semiconductor layer from deterioration.

When the invention is applied to the formation of organic TFTs having different conductivity, a semiconductor film containing an organic material having one type of conductivity can be patterned in the state where there is a mask over a semiconductor layer containing an organic material having the other type of conductivity. Therefore, etching of the surface of the semiconductor layer having the other type of conductivity by the patterning can be prevented. In addition, unnecessary reduction of a film in a semiconductor layer and physical damage to a semiconductor layer can be prevented.

A semiconductor layer can be protected from water, light, oxygen, or the like from external environment more certainly by providing a barrier layer between the semiconductor layer and a mask. Water can be prevented from penetrating into the semiconductor layer by a barrier layer even in the case where the mask retains water.

BEST MODE FOR CARRYING OUT THE INVENTION

Figure 1A:
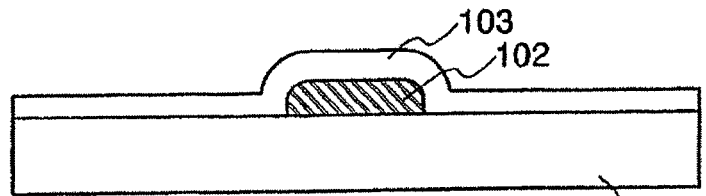
FIGS. 1A to 1E are explanatory views of a manufacturing step of a semiconductor device according to the present invention.

Embodiment modes according to the present invention are described in detail with reference to the drawings. However, it is easily understood by those skilled in the art that embodiments and details herein disclosed can be modified in various ways without departing from the purpose and the scope of the present invention. Therefore, it should be noted that the description of embodiment modes to be given below should not be interpreted as limiting the present invention. In addition, the same reference numeral is given to a common portion in each drawing, and detailed description is omitted.

Embodiment Mode 1

In this embodiment mode, a manufacturing method of an organic TFT according to the present invention is explained with reference to FIGS. 1A to 1E.

A substrate 101 having an insulating surface is prepared as shown in FIG. 1A. A glass substrate, a quartz substrate, or a substrate formed from an insulating substance such as alumina can be used as this substrate 101. In addition, a substrate having flexibility may be used, and a substrate comprising one selected from polyethylene terephthalate (PET), polyethylenenaphthalate (PEN), polyethersulfone (PES), polycarbonate (PC), polyimide, and the like may be used.

Then, a gate electrode 102 of a TFT is formed over the substrate 101 using a material having conductivity by a droplet discharge method, a printing method, an electric field plating method, a PVD (Physical Vapor Deposition) method, a CVD (Chemical Vapor Deposition) method, a vapor deposition method, or the like. The film thickness of the gate electrode 102 is preferably from 100 nm to 500 nm. In the case of using a PVD method, a CVD method, a vapor deposition method, or the like, the gate electrode 102 is formed to be etched in a desired shape after deposition.

As a material having conductivity, metal such as Ag, Au, Cu, Ni, Pt, Pd, Ir, Rh, W, Al, Ta, Mo, Cd, Zn, Fe, Ti, Si, Ge, Zr, or Ba; indium tin oxide (ITO); zinc oxide (ZnO), indium zinc oxide (IZO), zinc oxide (GZO) added with gallium, or indium tin oxide containing silicon oxide, each of which is used as a transparent conductive film; organic indium; organic tin; titanium nitride (TiN); or the like is appropriately used. In addition, a conductive layer formed from any of these materials may be stacked.

In the case of forming a gate electrode by a droplet discharge method, a composition in which a conductor is dissolved or dispersed in a solvent is used for a composition which is to be discharged from a discharge opening. Metal of the material having conductivity, a fine particle of silver halide, or a dispersant nanoparticle can be used as the conductor.

As for the composition to be discharged from a discharge opening, it is preferable to use any material of gold, silver, and copper dissolved or dispersed in a solvent in consideration of a specific resistance value. It is more preferable to use silver or copper which has low resistance and is inexpensive. As for the solvent, esters such as butyl acetate or ethyl acetate; alcohols such as isopropyl alcohol or ethyl alcohol; methyl ethyl ketone; an organic solvent such as acetone; or the like may be used.

The viscosity of the composition used for a droplet discharge method is preferably in the range of 5 mPa·s to 20 mPa·s to prevent the composition from drying and to discharge the composition smoothly from a discharge opening. The surface tension is preferably 40 m/N or less. Note that the viscosity of the composition and the like may be appropriately adjusted in accordance with a solvent to be used and an intended use. For example, the viscosity of a composition in which ITO, ZnO, IZO, GZO, indium tin oxide containing silicon oxide, organic indium, organic tin, or the like is dissolved or dispersed in a solvent is 5 mPa·s to 20 mPa·s, the viscosity of a composition in which silver is dissolved or dispersed in a solvent is 5 mPa·s to 20 mPa·s, and the viscosity of a composition in which gold is dissolved or dispersed in a solvent is 10 mPa·s to 20 mPa·s.

The diameter of a particle of the conductor is preferably made as small as possible for the purpose of preventing a clogged nozzle and for manufacturing high-definition pattern, although the diameter of each nozzle depends on a desired shape of a pattern and the like. Preferably, the diameter of the particle of the conductor is 0.1 μm or less. The composition is formed by a known method such as an electrolytic method, an atomization method, a wet reduction method, or the like, and in general, the particle size thereof is approximately 0.5 μm to 10 μm. However, when a gas evaporation method is employed, a nanoparticle protected by a dispersant is minute, approximately 7 nm. When each surface of nanoparticles is covered with a coating, the nanoparticles do not cohere in the solvent and are stably dispersed in the solvent at room temperature, and show a property similar to that of liquid. Accordingly, it is preferable to use a coating.

The step of discharging the composition may be performed under reduced pressure. This is because the solvent of the composition is vaporized during a period from the point of discharging to the point of landing on an object to be treated, and thus, later steps of drying and baking can be omitted or shortened. After discharging the solution, either or both steps of drying and baking is/are performed under atmospheric pressure or reduced pressure according to the solution by laser light irradiation, rapid thermal annealing, a heating furnace, or the like each step of drying and baking is a step of heat treatment. For example, drying is performed for three minutes at 100° C. and baking is performed for 15 minutes to 120 minutes at temperatures of from 200° C. to 350° C., each of which has a different purpose, temperature, and period. The substrate may be heated to favorably perform the steps of drying and baking. The temperature of heating the substrate at the time depends on a material of the substrate or the like, but it is set at 100° C. to 800° C. (preferably, 200° C. to 350° C.). According to the steps, fusion and welding among conductive particles are accelerated by vaporizing the solvent in the solution or chemically removing a dispersant and curing and shrinking a resin around the conductive particle. The steps of drying or baking are performed in an oxygen atmosphere, a nitrogen atmosphere, or an atmospheric air. The steps are preferably performed in an oxygen atmosphere where the solvent in the solution is likely to vaporize. However, a binder formed from an organic substance remains in the conductive layer according to the heating temperature, atmosphere, or period.

In this embodiment mode, a conductive layer containing silver as its main component is formed as the gate electrode by selectively discharging a solution dispersed with silver particles of several nanometers (hereinafter referred to as "Ag paste") and drying and baking the same.

Subsequently, a gate insulating film 103 having a film thickness of from 100 nm to 400 nm is formed over the gate electrode 102. The gate insulating film 103 can be formed to have a single layer structure or a stacked layer structure of an insulating film containing silicon nitride, silicon oxide, or an other insulating film containing silicon by a thin film formation method such as a plasma CVD method or a sputtering method. The gate insulating film 103 preferably has a stacked layer structure of a silicon nitride film (silicon nitride oxide film), a silicon oxide film, and a silicon nitride film (silicon nitride oxide film) from the side being in contact with the gate electrode. Since the gate electrode is in contact with a silicon nitride film or a silicon nitride oxide film in this structure, deterioration of the gate electrode due to oxidation can be prevented.

Alternatively, the gate insulating film 103 can be formed using an insulating solution by a droplet discharge method, a coating method, a sol-gel method, or the like. As a typical example of the insulating solution, a solution dispersed with inorganic oxide particles, polyimide, polyamide, polyester, acrylic, PSG (phosphorous glass), BPSG (phosphorous boron glass), silicate-based SOG (Spin on Glass), alkoxy silicate-based SOG, polysilazane-based SOG, and $SiO_2$ including a Si—$CH_3$ bond typified by polymethyl siloxane can be appropriately used.

Figure 1B:
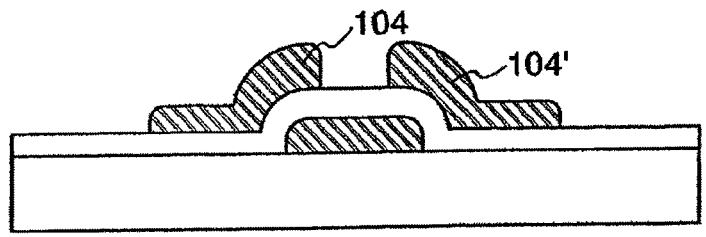

Next, as shown in FIG. 1B, source and drain electrodes 104 and 104' are formed over the gate insulating film 103 using a conductive material. The source and drain electrodes can be formed by the similar material and method as those of the gate electrode 102, and the film thicknesses thereof are preferably 300 nm to 800 nm. Here, the source and drain electrodes 104 and 104' are formed by selectively discharging solution of Ag paste dispersed with silver particles of several nanometers and by drying.

Figure 1C:
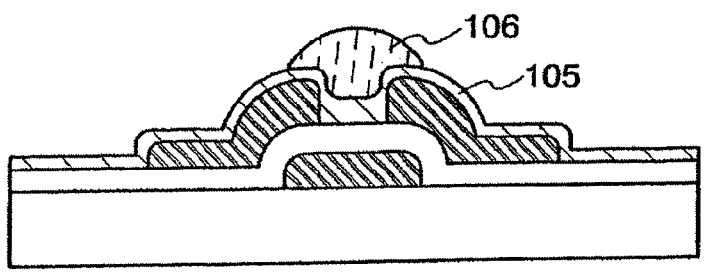
Figure 1D:
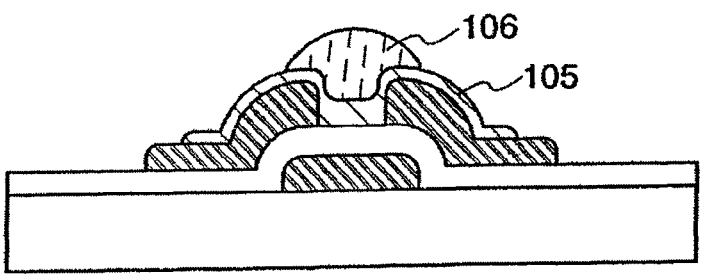

Then, as shown in FIG. 1C, a semiconductor film 105 is formed from an organic semiconductor material over the source and drain electrodes 104 and 104' by a printing method, a spray method, a spin-coating method, a droplet discharge method, a vapor deposition method, a CVD method, or the like. Since the semiconductor film 105 may be a size larger than a desired semiconductor layer, the semiconductor layer 105 may be formed over the whole surface as shown in FIG. 1C or may be formed not over the whole surface but a part of a region as shown in FIG. 1D.

When a high molecular weight based material is used among organic semiconductor materials, a dipping method, a casting method, a bar coating method, a spin coating method, a spray method, an ink-jet method, or a printing method may be appropriately used. An organic molecular crystal or an organic high molecular weight compound material may be used as an organic semiconductor material. As a specific organic molecular crystal, a polycyclic aromatic compound, a conjugated double bond-based compound, carotene, a macrocycle compound or a complex thereof, phthalocyanine, a charge transfer complex (CT complex), a TTF (tetrathiofulvalene):TCNQ (tetracyanoquinodimethane) complex, a free radical, diphenylpicrylhydrazyl, pigment, and protein can be given. On the other hand, as a specific organic high molecular weight compound material, a high molecular weight material such as a π-conjugated polymer (high molecular weight), polyvinilpyridine, an iodide complex, a phthalocyanine metal complex, or the like can be given. Especially, it is preferable to use a π-conjugated polymer (high molecular weight) having a skeleton including a conjugated double bond such as polyacetyrene, polyaniline, polypyrrole, polythienylene, polythiophene derivatives, poly(3-hexylthiophene) [P3HT, that is, a high molecular weight material that alkyl group of polythiophene derivatives in which flexible alkyl group is introduced to three positions of polythiophene is hexil group], poly(3-alkylthiophene), poly(3-docosylthiophene), polyparaphenylene derivatives, or polyparaphenylene vinylene derivatives.

An organic semiconductor film formed from a low molecular weight based material may be formed by a vapor deposition method. For example, a thiophene oligomer film (degree of polymerization is 6) or a pentacene film may be formed by a vapor deposition method.

In particular, in the case where the substrate 101 is a large substrate, full of flexibility, or the like, the organic semiconductor film is preferably formed by the method of dropping a solution. Then, a solvent is made to vaporize by leaving naturally or baking to form the semiconductor film 105. The semiconductor film 105 preferably has a film thickness of from 20 nm to 100 nm, and the film thickness thereof is set to be 50 nm here.

Then, a mask 106 is formed from an insulating material to have a film thickness of from 400 nm to 2 μm so as to be in contact with the semiconductor film 105. One feature of the invention is to form a mask by a method without physical damage to the semiconductor film 105, that is, by a method or the like for exposing light using a photomask after being formed by a droplet discharge method, a printing method, and a droplet discharge method. These methods for forming a mask are extremely favorable since physical damage to the semiconductor film 105 is less than that of a plasma method or a sputtering method.

A heat-resistant high molecular weight material is preferably used as an insulating material, and a high molecular weight material which has an aromatic ring or a heterocyclic ring as a main chain and includes at least a highly polar heteroatom group in an aliphatic portion can be used. As typical examples of such high molecular weight substances, polyvinyl alcohol (PVA), acrylic, siloxane, polyimide, and the like can be given. When a photo mask is used as the mask 106, a photosensitive resin material such as an epoxy resin, a phenol resin, a novolac resin, an acrylic resin, a melamine resin, a urethane resin, or the like is used as an insulating film of a photosensitive resin. In addition, photosensitive organic materials such as benzocyclobutene, parylene, flare, and polyimide can also be used. As typical positive photosensitive resins, a photosensitive resin having a novolac resin and a naphthoquinonediazide compound as a photosensitive agent can be given, while as typical negative photosensitive resins, a photosensitive resin having a base resin, diphenylsilanediol, an acid generating agent, and the like can be given. When an organic material is used for a mask, the unevenness of a semiconductor film in a lower layer is hardly reflected due to its superior planarity; therefore, the film thickness of a film formed over the mask can be uniform and disconnection can be also prevented.

When the mask is formed by a droplet discharge method, an object in which the above insulating material is dissolved or dispersed into a solvent is used as a compound which is to be discharged from a discharge opening.

Figure 1E:
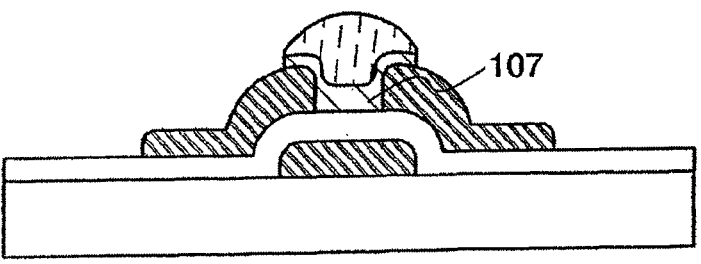

Then, the semiconductor film 105 is patterned using the mask 106 to form a semiconductor layer 107 as shown in FIG. 1E. As a patterning method, there are $O_2$ ashing, $O_3$ ashing, and the like. In the case where the mask is formed from an organic material, the mask is etched in some degree as well as the semiconductor layer when the patterning is performed. However, the film thickness of the mask is extremely thick compared with that of the semiconductor layer and etching of the mask is not a problem; therefore, etching selectivity between the mask and the organic semiconductor layer is not required to consider so much. The mask 106 is not removed to remain over the semiconductor layer 107, and thus an organic TFT is completed. After completing the organic TFT, an insulating film, a passivation film, and the like are formed above the TFT to form a semiconductor device.

Thus, one step of removing a mask can be eliminated, and the penetration of moisture into the semiconductor layer associated with the removal of a mask can be prevented by completing an organic TFT without removing a mask used for the patterning of a semiconductor layer. Physical influence such as deterioration caused by light, oxygen, moisture, or the like and etching can be prevented by making a mask remain over the semiconductor layer, and the remaining mask can be made to serve as a protective film of the organic semiconductor layer.

Figure 2:
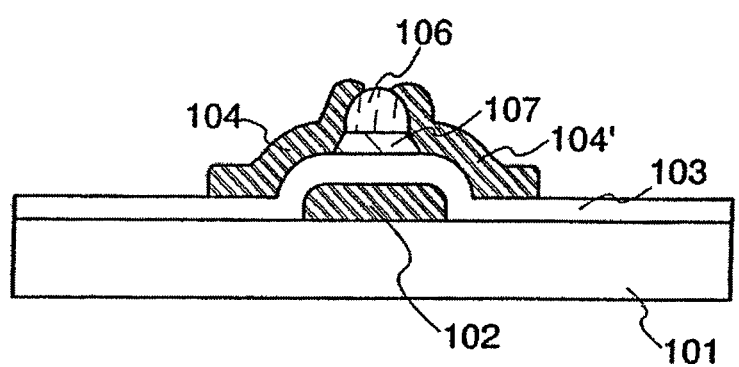
FIG. 2 is an explanatory view of a semiconductor device according to the invention.

In the above step, the semiconductor layer is formed after forming the source and drain electrodes to complete the organic TFT. Alternatively, the semiconductor layer 107 formed using an organic semiconductor material, may be formed after forming the gate insulating film 103, and the source and drain electrodes 104 and 104' may be formed thereafter. FIG. 2 shows a cross-sectional view of an organic TFT according to the invention formed by this step.

In the case of FIG. 2, a contact region of the semiconductor layer 107 and the source and drain electrodes 104 and 104' becomes reduced since the mask 106 remains. Therefore, the semiconductor film may be patterned in a reverse tapered shape when the semiconductor film is patterned. According to this, the contact region of the semiconductor layer and the source and drain electrodes become larger, and also, disconnection of the source and drain electrodes can be prevented.

In the case where the source and drain electrodes are formed after forming the semiconductor layer, the semiconductor layer may be influenced by plasma, vapor deposition, sputtering, or the like when the source and drain electrodes are formed. However, by applying the invention, the semiconductor layer is protected from the influence of plasma, vapor deposition, sputtering, or the like by a mask; therefore, the semiconductor layer can be prevented from being physically damaged.

Embodiment Mode 2

In this embodiment mode, a method for forming a top gate organic TFT is explained with reference to FIGS. 3A to 3D. In FIGS. 3A to 3D, as for the same reference numerals as in Embodiment Mode 1, the material, the forming method, and the like are referred to the description in Embodiment Mode 1.

Figure 3A:
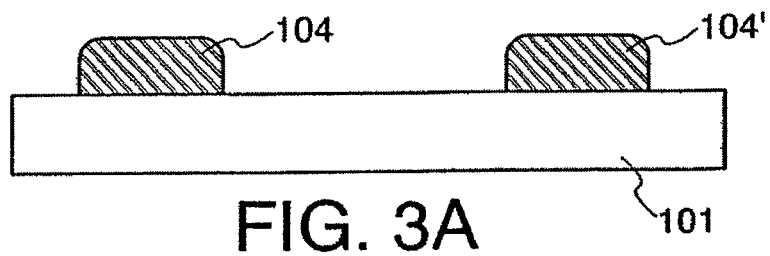
FIGS. 3A to 3D are explanatory views of a manufacturing step of a semiconductor device according to the invention.
Figure 3B:
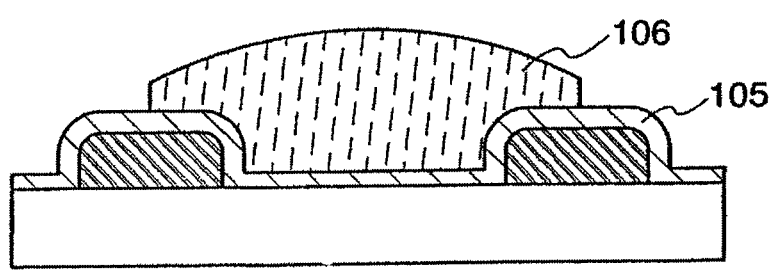

Source and drain electrodes 104 and 104' are formed over a substrate 101. Then, a semiconductor film 105 containing an organic material is formed over the substrate 101 and the source and drain electrodes, and then, a mask 106 is formed so as to be in contact with the semiconductor film 105 (FIGS. 3A and 3B).

Figure 3C:
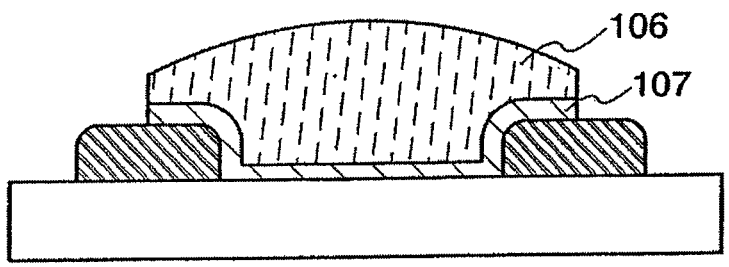
Figure 3D:
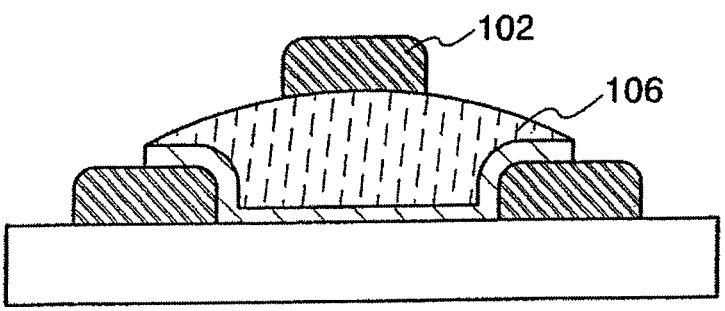

Next, as shown in FIG. 3C, the semiconductor film 105 is patterned using the mask 106 to form a semiconductor layer 107. Subsequently, a gate electrode 102 is formed over the mask 106 in the state where the mask 106 is not removed to remain (FIG. 3D). In this embodiment mode, the mask 106 serves as both a protective film of the semiconductor layer 107 and a gate insulating film.

A top gate organic TFT is completed with the mask 106 remaining over the semiconductor layer 107 as in this embodiment mode, and thus a step of forming a gate insulating film is eliminated, and physical influence such as plasma or sputtering on the semiconductor layer 107 when a gate insulating film is formed can be eliminated. In addition, deterioration of the semiconductor layer 107 caused by water, light, oxygen, or the like from outside can be prevented.

Embodiment Mode 3

In this embodiment mode, a method for forming a first element which is an N type organic TFT and a second element which is a P type organic TFT simultaneously is explained with reference to FIGS. 4A to 4E. In FIGS. 4A to 4E, as for a substrate, a gate electrode, a gate insulating film, source and drain electrodes, a mask, a semiconductor film, a semiconductor layer, and the like having the same reference numerals as in Embodiment Mode 1, the material; the forming method, and the like thereof are referred to the description in Embodiment Mode 1.

Figure 4A:
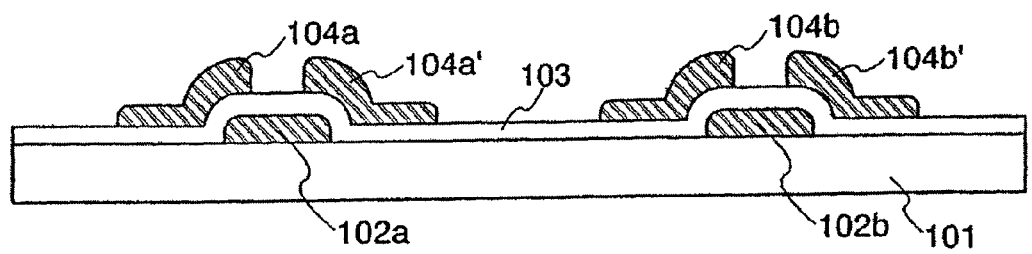
FIGS. 4A to 4E are explanatory views of a manufacturing step of a semiconductor device according to the invention.

A gate electrode 102a of a first element and a gate electrode 102b of a second element are formed over a substrate 101 in FIG. 4A. Then, a gate insulating film 103 is formed over the gate electrode 102a of the first element and the gate electrode 102b of the second element. Further, source and drain electrodes 104 and 104a' of the first element, and source and drain electrodes 104b and 104b' of the second element are formed over the gate insulating film 103.

Figure 4B:
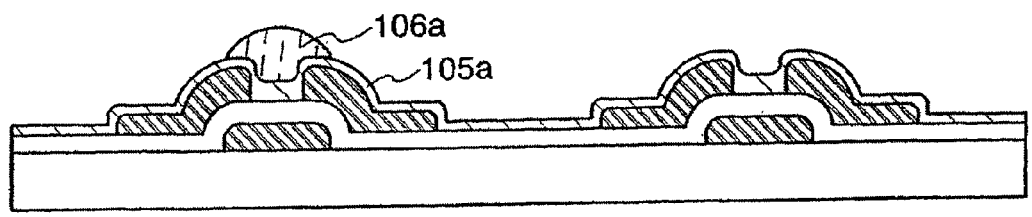

Subsequently, as shown in FIG. 4B, a first semiconductor film 105a is formed over the source and drain electrodes of the first and second elements. As for the first semiconductor film 105a, any of an N type organic semiconductor material and a P type organic semiconductor material may be used, and an N type organic semiconductor material is used here. As for the specific N type organic semiconductor material, any of materials can be used within the operating range of an N type organic TFT which is to be completed. The first semiconductor film 105a may be formed over the whole surface as shown in FIG. 4B or may be partially formed in a region to which an N type semiconductor layer is formed as shown in FIG. 1D.

Figure 4C:
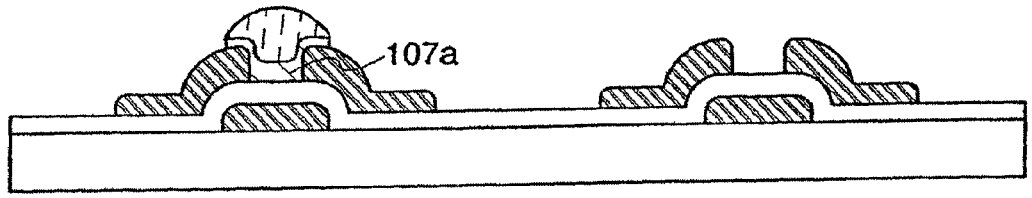

Next, a first mask 106a is formed over the first semiconductor film 105a and the first semiconductor film 105a is patterned using the first mask to form a semiconductor layer 107a of the first element (FIG. 4C).

Figure 4D:
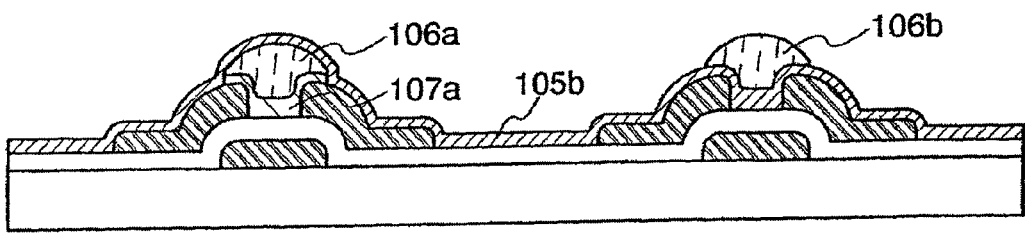

Then, as shown in FIG. 4D, a second semiconductor film 105b formed from a P type organic semiconductor material is formed with the first mask remaining over the semiconductor layer 107a. As for the P type organic semiconductor material, any of materials can be used within the operating range of a P type organic TFT which is to be completed, and pentacene is used here. A second mask 106b is formed over the second semiconductor film 105b, and the second semiconductor film is patterned using the second mask. At this time, the first mask 106a remains over the semiconductor layer 107a; therefore, the semiconductor layer 107a can be prevented from being physically damaged when the second semiconductor film is patterned.

Figure 4E:
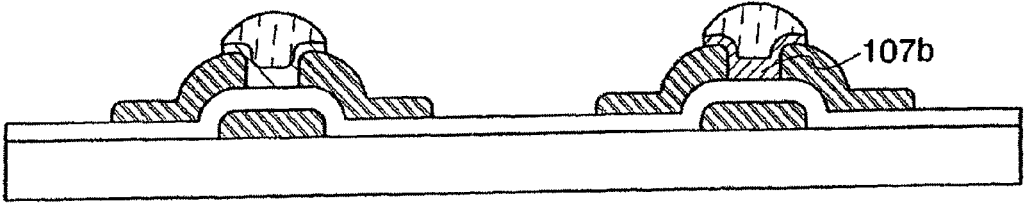

According to the above, the first element and the second element are completed by forming a semiconductor layer 107b of the P type organic TFT which is the second element, and the N type organic TFT and the P type organic TFT can be formed over the same substrate (FIG. 4E). In addition, a complementary TFT may include the N type organic TFT and the P type organic TFT formed according to this embodiment mode.

In the case of forming the N type and P type organic TFTs over one substrate, a step of forming the N type organic semiconductor layer and a step of forming the P type organic semiconductor layer are required to be separately provided. Therefore, an organic semiconductor layer having one type of conductivity formed in advance is physically damaged in some cases. In addition, there is not so much difference in etching rate since both, of the organic semiconductor layers contain organic materials; therefore, an organic semiconductor layer having one type of conductivity formed in advance is drastically etched in some cases while the patterning of the other organic semiconductor layer is performed.

However, according to the invention, physical influence on an organic semiconductor layer formed in advance caused by patterning an organic semiconductor layer formed afterward can be reduced since the organic semiconductor layer formed in advance is protected by a mask remaining thereover. Furthermore, a mask used for the patterning can be utilized as a protective film; therefore, the number of steps is not required to increase newly, and conversely, a step of removing a mask can be omitted, and thus a manufacturing step can be substantially reduced. Moreover, the penetration of light, heat, oxygen, or the like into an organic semiconductor layer can be prevented by a mask which serves as a protective film, and thus an organic TFT with high reliability can be provided.

This embodiment mode explains a step of forming an organic semiconductor layer after forming source and drain electrodes as shown in FIGS. 1A to 1E in Embodiment Mode 1. However, it is obvious that, as shown in FIG. 2, source and drain electrodes may be formed after forming a semiconductor layer or N type and P type organic TFTs may be formed so as to have a top gate structure in Embodiment Mode 2.

Embodiment Mode 4

In this embodiment mode, an N type organic TFT and a P type organic TFT included in one pixel of an electroluminescence (EL) display device are explained with reference to FIGS. 5A to 7B. In FIGS. 5A to 7B, as for the same reference numerals as in Embodiment Modes 1 to 3, the material, the forming method, and the like thereof are referred to the description in Embodiment Modes 1 to 3.

Figure 5A:
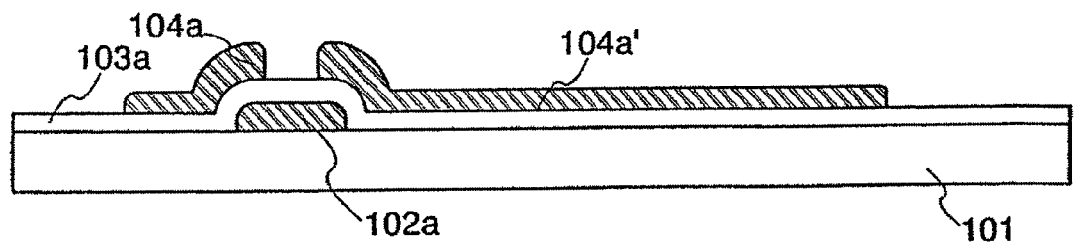
FIGS. 5A to 5D are explanatory views of a manufacturing step of a semiconductor device according to the invention.
Figure 5B:
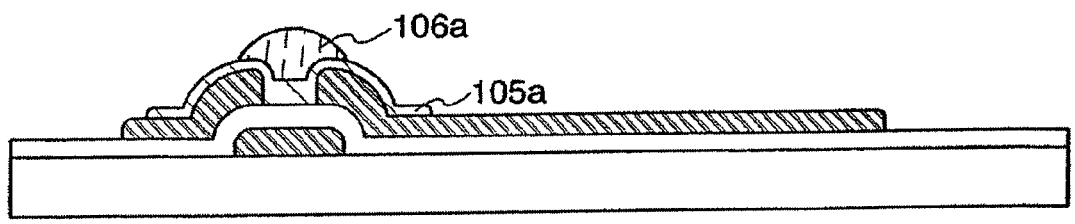

First, a gate electrode 102a of a first element is formed over a substrate 101. As for the first element, any of an N type organic TFT and a P type organic TFT may be used, and an N type organic TFT is used here. A gate insulating film 103a, source and drain electrodes 104a and 104a' are formed over the gate electrode 102a of the first element (FIG. 5A). Then, a first semiconductor film 105a containing an N type organic semiconductor material and a first mask 106a are formed (FIG. 5B). Here, the first semiconductor film 105a is partially formed; however, the first semiconductor film 105a may be formed over the whole surface.

Figure 5C:
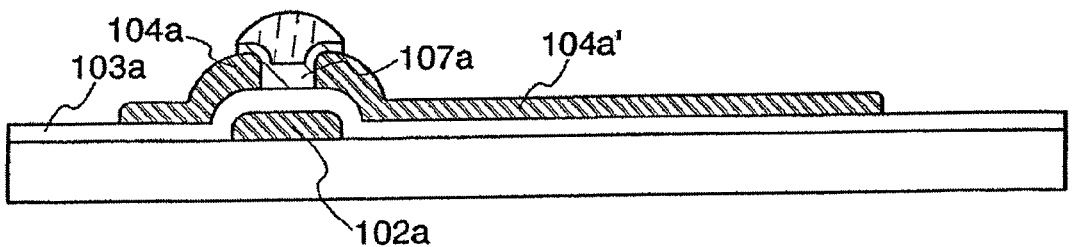

The first semiconductor film is etched using the first mask to form a semiconductor layer 107a containing an N type organic material of the first element. At this stage, the first element having the gate electrode 102a, the gate insulating film 103a, the source and drain electrodes 104a and 104a' and the semiconductor layer 107a containing an organic material is formed (FIG. 5C).

Figure 5D:
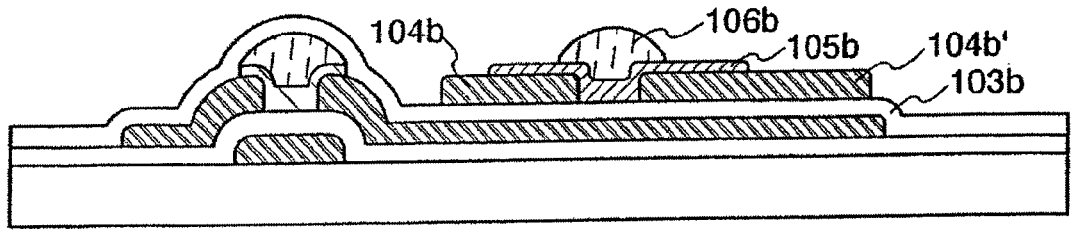
Figure 6A:
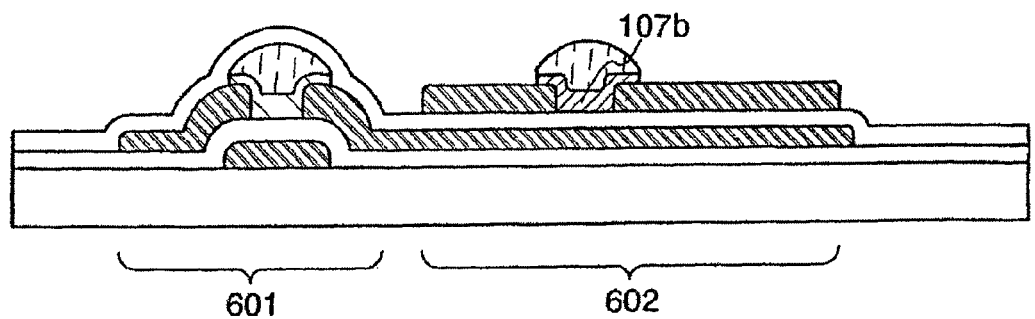
FIGS. 6A and 6B are explanatory views of a manufacturing step of a semiconductor device according to the invention.

Then, as shown in FIG. 5D, a second element which is a P type organic TFT is formed. A gate insulating film 103b, source and drain electrodes 104b and 104b', a second semiconductor film 105b containing a P type organic semiconductor material, and a second mask 106b of the second element are sequentially formed. Here, the second semiconductor film 105b is partially formed; however, the second semiconductor film 105b may be formed over the whole surface. The second semiconductor film is etched using the second mask to form a semiconductor layer 107b containing a P type organic material of the second element. According to the above steps, an N type organic TFT 601 and a P type organic TFT 602 are formed (FIG. 6A).

Figure 6B:
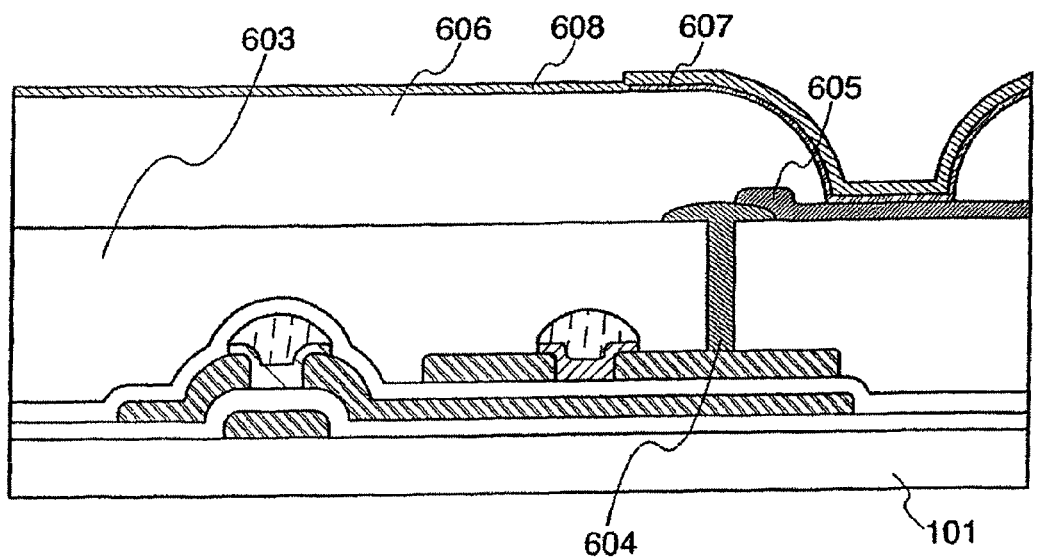

And then, as shown in FIG. 6B, an insulating film 603 is formed. Any of an inorganic film and an organic film may be used as the insulating film. Continuously, a wiring 604 which is connected to the drain electrode 104b' of the P type organic TFT 602 is formed, and a conductive layer 605 is formed so as to be connected to the wiring. Then, an insulating layer 606 which is to be an embankment is formed, and an electroluminescent layer 607 and a conductive layer 608 are stacked so as to be in contact with the conductive layer 605. In the above structure, the conductive layer 605 corresponds to an anode and the conductive layer 608 corresponds to a cathode since a TFT which drives a light emitting element is the P type organic TFT. In addition, light from a light emitting element is emitted toward the substrate 101 side, that is, a bottom emission structure. However, the structure of an EL element in this embodiment mode, any structure may be used if light is emitted using the N type organic TFT 601 and the P type organic TFT 602, and the structure is not limited to the structure of the EL element illustrated in this embodiment mode.

According to the above steps, a display device which drives an EL element by the P type and N type organic TFTs is completed. The drain electrode 104a' of the first element can also serves as a gate electrode of the second element by manufacturing a display device according to the method in this embodiment mode. Therefore, a step of electrically connecting the drain electrode of the first element and the gate electrode of the second element can be omitted and a manufacturing process can be shortened.

In this embodiment mode, a bottom, gate structure is employed for the first element and the second element; however, the structure is not limited thereto, and the first element may be a top gate structure and the second element may be a bottom gate structure. Also in this case, one of the source and drain electrodes of the first element can also serves as the gate electrode of the second element.

Figure 7A:
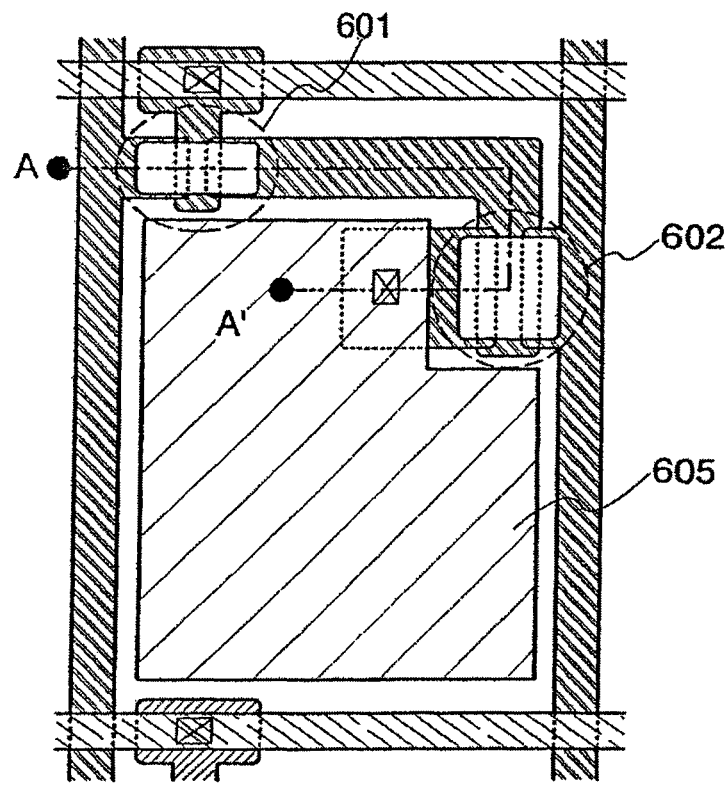
FIGS. 7A and 7B are a top view and a circuit diagram of a display device according to the invention.
Figure 7B:
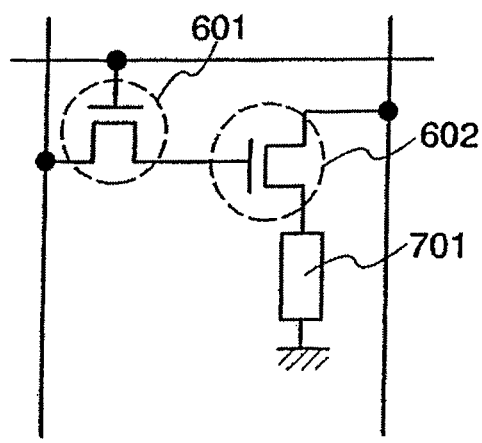

FIG. 7A shows a top view of a pixel portion of the display device manufactured according to this embodiment mode and FIG. 7B shows a circuit diagram thereof. FIG. 6B is a cross-sectional view taken along line A-A' of a pixel portion of the display device of FIG. 7A. Reference numeral 701 shown in FIG. 7B denotes an EL element, which includes the conductive layers 605 and 608 and the electroluminescent layer 607 in FIG. 6B.

The present invention can be freely combined with Embodiment Mode 1 to 3 within the range of enablement.

Embodiment Mode 5

In this embodiment mode, a structure provided with a barrier layer between an organic semiconductor layer and a mask which is to be a protective film thereof in Embodiment Modes 1 to 4 is explained with reference to FIGS. 8A and 8B.

Figure 8A:
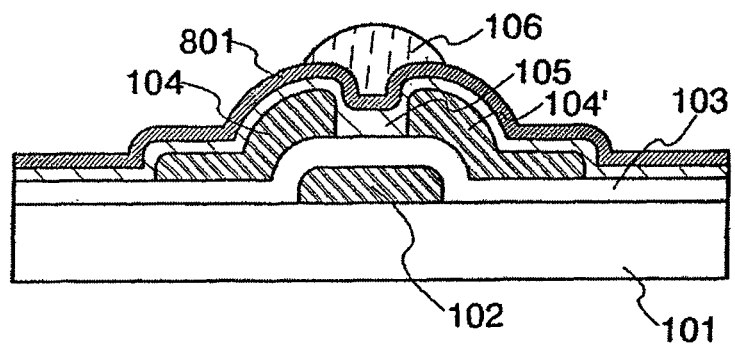
FIGS. 8A and 8B are explanatory views of a manufacturing step of a semiconductor device according to the invention.

As shown in FIG. 8A, steps up to the formation of source and drain electrodes of a bottom gate TFT over a substrate are similar to those shown in FIGS. 1A and 1B in Embodiment Mode 1. Then, after forming a semiconductor film 105 containing an organic material, an inorganic film 801 is formed so as to be in contact with the semiconductor film 105. The inorganic film is formed of a silicon oxide film, a silicon nitride film, or a silicon oxynitride film, or a stacked film including at least two layers thereof. A CVD method, a sputtering method, a vapor deposition method, a droplet discharge method, printing method, or the like can be used as a method for forming the inorganic film. Considering physical damage to the semiconductor film, a droplet discharge method, a printing method, or the like is preferably used as a method for forming the Inorganic film 801.

Figure 8B:
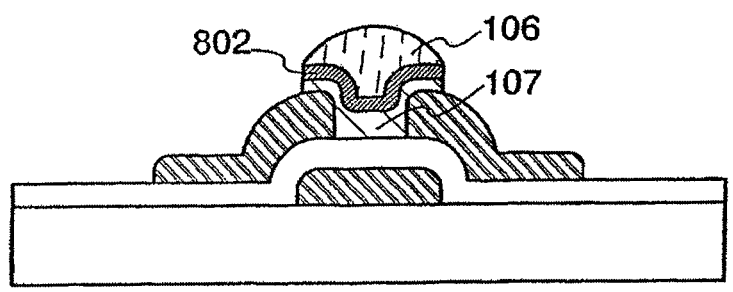

Next, a mask 106 is formed so as to be in contact with the inorganic film 801 to etch the inorganic film 801 and the semiconductor film 105 using the mask 106 as shown in FIG. 8B. The inorganic film 801 is firstly etched using the mask 106, then the semiconductor film 105 is etched using the mask 106. An organic TFT having a barrier layer 802 between a semiconductor layer 107 and the mask 106 is completed by the etching. The barrier layer also serves as a protective film of the semiconductor layer, in addition to the mask, by providing the barrier layer; therefore, the semiconductor layer can be protected from water, light, or oxygen with more certainty.

An organic material is generally used to form the mask 106; therefore, the mask itself absorbs and retains water in some cases. However, the barrier layer is provided between the mask and the semiconductor layer, and according to this, moisture of the mask is prevented from penetrating into the semiconductor layer by the barrier layer even though the mask retains water. Thus, an organic TFT with higher reliability can be provided. The number of manufacturing steps is not so much increased since the barrier layer can be etched utilizing the mask 106.

In this embodiment mode, the explanation is made using a bottom gate organic TFT shown in FIG. 1E; however, it is obvious that this embodiment mode can be applied to a bottom gate organic TFT of FIG. 2 or a top gate organic TFT of FIG. 3D. This embodiment mode can be freely combined with Embodiment Modes 1 to 4 within the range of enablement.

Embodiment Mode 6

Figure 9A:
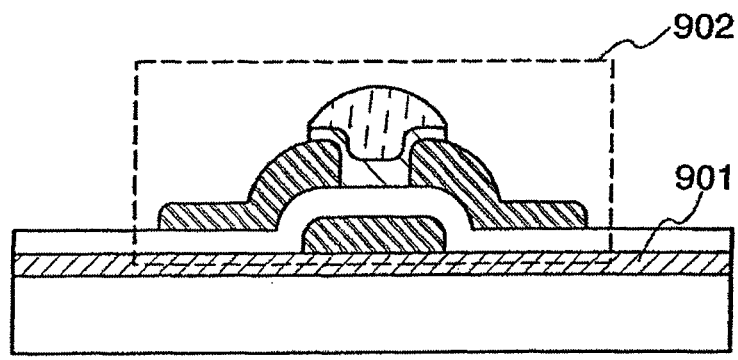
FIGS. 9A and 9B are explanatory views of semiconductor devices according to the invention.

In this embodiment mode, a structure for reducing deterioration of an organic semiconductor layer caused by water, an organic gas, or the like which penetrates from a substrate side is explained with reference to FIGS. 9A and 9B.

In this embodiment mode, a barrier layer 901 is provided between a substrate and an organic TFT. This barrier layer may be formed from silicon nitride which does not contain hydrogen formed by a radio frequency sputtering method or a multilayer film of the silicon nitride and a silicon oxide film. The barrier layer 901 may be formed over the whole surface of the substrate as shown in FIG. 9A or may be selectively formed only over a portion in which an organic TFT is to be formed above as shown in FIG. 9B. After forming the barrier layer 901, the organic TFT 902 explained in Embodiment Modes 1 to 5 is formed over the barrier layer.

This barrier layer is a barrier layer against water vapor or an organic gas which penetrate from the substrate side, which can prevent an organic semiconductor material and the like from deterioration caused by water vapor or an organic gas. When a structure provided with a barrier layer between a semiconductor layer and a mask explained in Embodiment Mode 5 is applied to this embodiment mode, water vapor or an organic gas can be prevented from above and below organic semiconductor layer.

This embodiment mode can be freely combined with Embodiment Modes 1 to 5 within the range of enablement.

Embodiment Mode 7

Figure 10A:
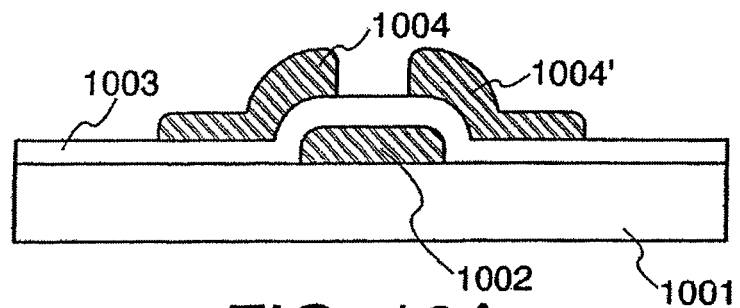
FIGS. 10A to 10C are explanatory views of a manufacturing step of a semiconductor device according to the invention.
Figure 10B:
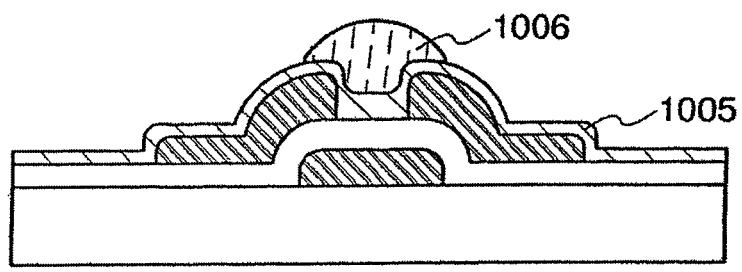

In this embodiment mode, an example in which an organic TFT of the present invention is formed using an organic material is described with reference to FIGS. 10A to 10C. First, a substrate 1001 having an insulating surface is prepared as shown in FIG. 10A. The substrate 1001 may have flexibility and light transmitting properties, and made of one selected from polyethylene terephthalate (PET), polyethylene naphthalate (PEN), polyethersulfone (PES), polycarbonate (PC), polyimide, and the like. The practical thickness of the substrate 1001 is from 10 μm to 200 μm.

A first conductive film which serves as a gate electrode 1002 of a TFT is formed over the substrate 1001 using a conductive paste. A conductive carbon paste, a conductive silver paste, a conductive copper paste, a conductive nickel, or the like are used as the conductive paste, and the conductive paste is pattered in the predetermined shape by a screen printing method, a roll coating method, or a droplet discharge method. After the conductive paste is formed in a predetermined pattern, leveling and drying are carried out, and then, curing is carried out at a temperature from 100° C. to 200° C.

Then, an insulating film which serves as a gate insulating film 1003 is formed over the gate electrode 1002. A first insulating film is formed from a material added with an acrylic resin, a polyimide resin, a polyamide resin, a phenoxy resin, a nonaromatic polyfunctional isocyanate, a melamine resin, or the like by a roll coating method, a spray method, or the like. The gate insulating film is preferably formed so as to have a film thickness of approximately from 100 nm to 200 nm in consideration of gate voltage.

Then, second conductive films which serves as source and drain electrodes 1004 and 1004' are formed over the gate insulating film 1003. As a material for the second conductive films, it is desired to use metals having a high work function for making an ohmic contact with the semiconductor layers, since a number of organic semiconductor materials are P type semiconductors in which materials for transporting electric charges transport positive holes as carriers. Concretely, the second conductive film is formed from a conductive paste including metal such as gold, platinum, chrome, palladium, aluminum, indium, molybdenum, or nickel, or alloys thereof by a droplet discharge method, a printing method, or a roll coating method.

Next, an organic semiconductor film is formed. When a high molecular weight based material is used among organic semiconductor films, a dipping method, a casting method, a bar coating method, a spin coating method, a spray method, a droplet discharge method, or a printing method may be appropriately used. An organic molecular crystal or an organic high molecular weight compound material may be used as an organic semiconductor material. As a specific organic molecular crystal, a polycyclic aromatic compound, a conjugated double bond-based compound, carotene, a macrocycle compound or a complex thereof, phthalocyanine, a charge transfer complex (CT complex), a TTF (tetrathiofulvalene): TCNQ (tetracyanoquinodimethane) complex, a free radical, diphenylpicrylhydrazyl, pigment, and protein can be given. On the other hand, as a specific organic high molecular weight compound material, a high molecular weight material such as a π-conjugated polymer (high molecular weight), polyvinilpyridine, an iodide complex, a phthalocyanine metal complex, or the like can be given. Especially, it is preferable to use a π-conjugated polymer (high molecular weight) having a skeleton including a conjugated double bond such as poly-acetyrene, polyaniline, polypyrrole, polythienylene, polythiophene derivatives, poly(3-hexylthiophene) [P3HT, that is, a high molecular weight material that alkyl group of polythiophene derivatives in which flexible alkyl group is introduced to three positions of polythiophene is hexil group], poly(3-alkylthiophene), poly(3-docosylthiophene), polyparaphenylene derivatives, or polyparaphenylene vinylene derivatives.

A vapor deposition method may be used for an organic semiconductor film formed from a low molecular weight based material. For example, a thiophene oligomer film (degree of polymerization is 6) or a pentacene film may be formed by a vapor deposition method.

In particular, in the case where the substrate 1001 is a large substrate, full of flexibility, or the like, the organic semiconductor film is preferably formed by the method of dropping a solution. Then, a solvent is made to vaporize by leaving naturally or baking to form a semiconductor film 1005 containing an organic material as shown in FIG. 10B.

An insulating layer which is to be a mask 1006 is formed so as to be in contact with the semiconductor film 1005. The mask may be formed by a droplet discharge method or a printing method, and in addition, the shape of the mask may be exposed to light using a photomask after being formed by a droplet discharge method. These method for forming a mask are preferable since physical damage to a semiconductor film is less than that of a plasma method or a sputtering method. A heat-resistant high molecular weight material is preferably used as the material of the insulating layer, and a high molecular weight material which has an aromatic ring or a heterocyclic ring as a main chain and includes at least a highly polar heteroatom group in an aliphatic portion can be used. As typical examples of such high molecular weight substances, polyvinyl alcohol (PVA), acrylic, siloxane, polyimide, and the like can be given. When a photo mask is used as the mask 1006, a photosensitive resin material such as an epoxy resin, a phenol resin, a novolac resin, an acrylic resin, a melamine resin, a urethane resin, or the like is used as an insulating film of a photosensitive resin. In addition, photosensitive organic materials such as benzocyclobutene, parylene, flare, and polyimide can also be used. As typical positive photosensitive resins, a photosensitive resin having a novolac resin and a naphthoquinonediazide compound as a photosensitive agent can be given, while as typical negative photosensitive resins, a photosensitive resin having a base resin, diphenylsilanediol, an acid generating agent, and the like can be given.

Figure 10C:
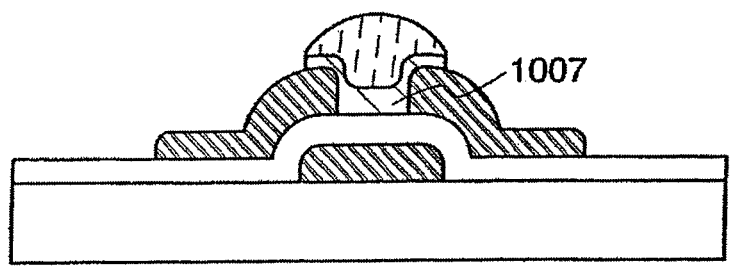

Then, the semiconductor film 1005 containing an organic material is etched using the mask 1006 to form a semiconductor layer 1007 containing an organic material as shown in FIG. 10C. The mask 1006 is not removed but to remain over the semiconductor layer 1007, and thus an organic TFT is completed. After completing the organic TFT, an insulating film, a passivation film, and the like are formed above the TFT to manufacture a semiconductor device.

As described above, a lightweight and flexible semiconductor device can be obtained by an organic TFT in which all the portion thereof are formed from organic compound materials. In addition, the organic TFT can be formed from an inexpensive organic material, and further, usability of the material can be heightened, and thus the cost of the semiconductor device can be reduced. A vacuum machine is not required to be used in a manufacturing step; therefore, a machine cost can be also reduced.

This embodiment mode can be freely combined with Embodiment Modes 1 to 6 within the range of enablement.

Embodiment Mode 8

Figure 11A:
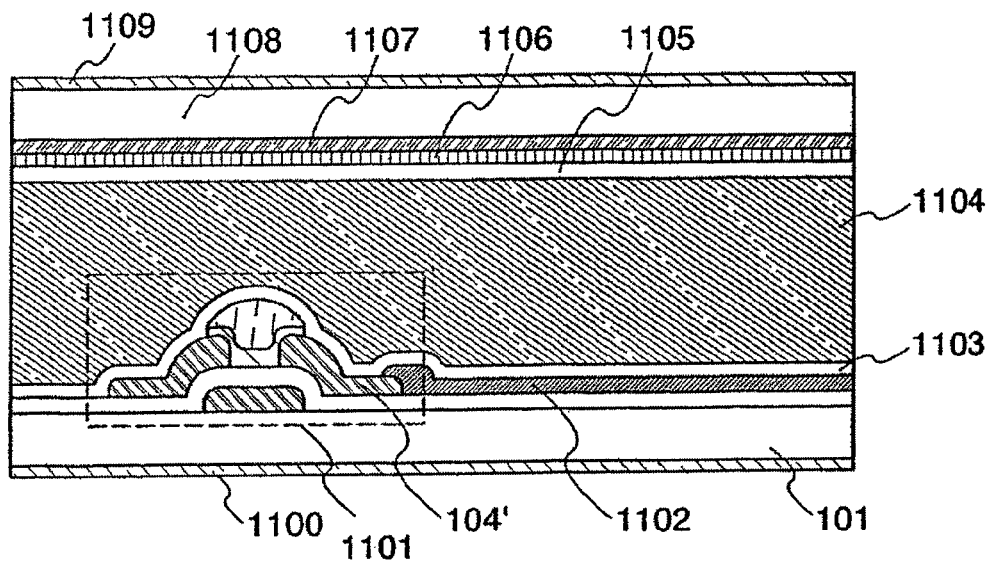
FIGS. 11A and 11B are views of display devices using the invention.
Figure 11B:
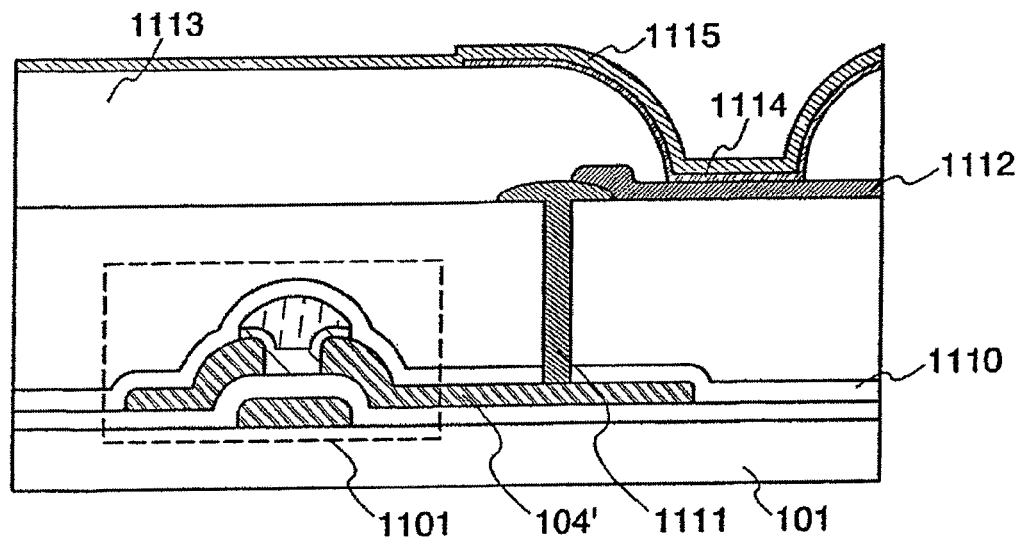

A method for manufacturing a display panel in a display device according to the present invention is explained with reference to FIGS. 11A and 11B. In FIGS. 11A and 11B, as for the same reference numerals as in Embodiment Modes 1 to 7, the material, the forming method, and the like thereof are referred to the description in Embodiment Modes 1 to 7.

Firstly, a method for manufacturing a liquid crystal display panel is explained with reference to FIG. 11A. An organic TFT 1101 formed according to Embodiment Modes 1 to 4 is formed over a substrate 101, a pixel electrode 1102 is formed so as to be connected to a drain electrode 104' included in the organic TFT 1101, and an orientation film 1103 is formed over the pixel electrode 1102. A substrate 1108 provided with a color filter 1107, an opposite electrode 1106, and an orientation film 1105 is prepared, and then pasted to the substrate 101 by a sealant (not shown). Then, a liquid crystal 1104 is injected to complete a display device provided with a display function. Polarizing plates 1100 and 1109 are pasted to the substrates 101 and 1108 respectively. Further, the orientation films 1103 and 1105, and the liquid crystal 1104 may be also formed by a droplet discharge method in order to realize the shortening of a manufacturing time and the reduction of a manufacturing cost.

A method for manufacturing a display panel in a display device including a light emitting element is explained with reference to FIG. 11B. An organic TFT 1101 formed according to Embodiment Modes 1 to 4 is formed over a substrate 101, and an insulating layer 1110 is formed over the organic TFT 1101. A wiring 1111 connected to a drain electrode 104' included in the organic TFT 1101 is formed, and a conductive layer 1112 is formed so as to be connected to the wiring. Subsequently, an insulating layer 1113 which is to be an embankment is formed, and an electroluminescent layer 1114 and a conductive layer 1115 are stacked so as to be in contact with the conductive layer 1112. In the above structure, when the organic TFT 1101 which drives the light emitting element is an N type organic TFT, the conductive layer 1112 corresponds to a cathode and the conductive layer 1115 corresponds to an anode. Thus, a display device which performs a so-called top emission, in which light from the light emitting element is emitted toward the opposite direction of the substrate 101 side, is completed. On the other hand, when the organic TFT 1101 which drives the light emitting element is a P type organic TFT, the conductive layer 1112 corresponds to an anode and the conductive layer 1115 corresponds to a cathode. Thus, a display device which performs a bottom emission, in which light from the light emitting element is emitted toward the substrate 101 side, is completed.

The display panel described in this embodiment mode is only one mode, and it is obvious that display panels having other various structures can be manufactured. This embodiment mode can be freely combined with Embodiment Modes 1 to 7 within the range of enablement.

Embodiment Mode 9

This embodiment mode is explained in detail with reference to FIGS. 12A and 12B. A display device according to this embodiment mode has a pixel portion provided with an electronic ink formed from a microcapsule which is incorporated with a contrast medium in which reflectivity changes by applying electric field or a charged particle in which reflectivity changes by applying electric field in each pixel, and an organic TFT controlling electric field which will be applied to each pixel.

Figure 12A:
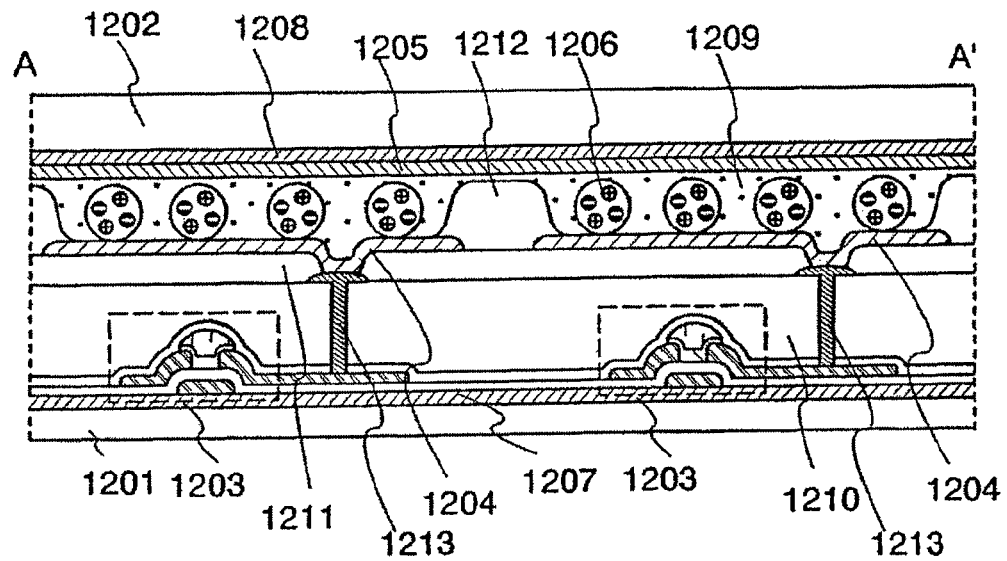
FIGS. 12A and 12B are views of a display device having an electronic ink using the invention.
Figure 12B:
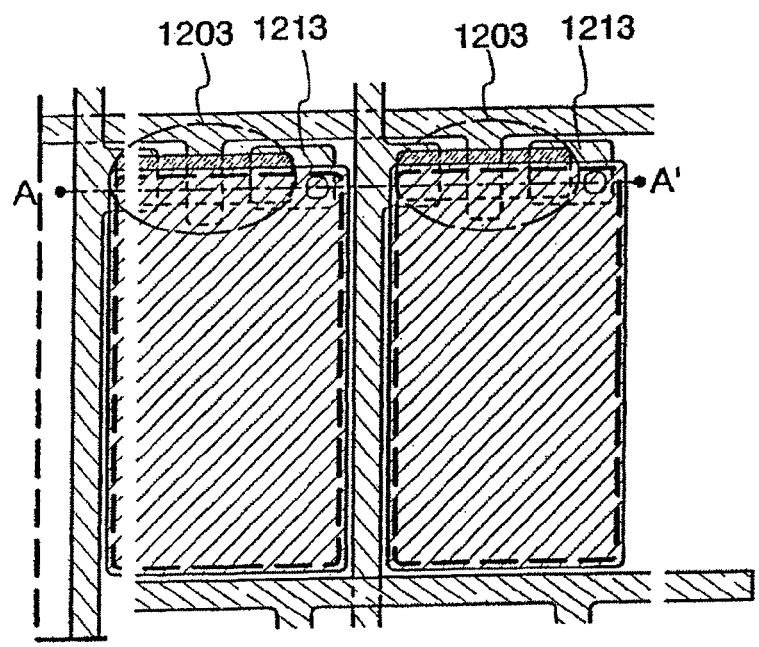

FIG. 12A is a longitudinal sectional view which explains the structure of a pixel portion and FIG. 12B shows a top view. An organic TFT 1203 in which an organic semiconductor layer is used as explained in Embodiment Modes 1 to 7 exists between plastic substrates 1201 and 1202. An electron ink layer 1209 including a microcapsule 1206 incorporated with a charged particle is arranged between a pixel electrode 1204 electrically connected to each organic TFT and a common electrode 1205 in the opposing side of the pixel electrode. Insulating films 1210 to 1212 are formed from insulating materials, and a wiring 1213 electrically connects the pixel electrode 1204 and the organic TFT 1203. The longitudinal sectional view shown in FIG. 12A corresponds to line A-A' shown in FIG. 12B.

At least one of the plastic substrates 1201 and 1202 has light transmitting property, and the material thereof is selected from polyethylene terephthalate (PET), polyethylenenaphthalate (PEN), polyethersulfone (PES), polycarbonate (PC), polyimide, and the like. The plastic substrates preferably have flexibility, and the practical thickness thereof is from 10 μm to 200 μm. The embodiment of the invention is not essentially affected even if the thickness of the plastic substrate increases to be greater than the above described range, as a matter of course.

Barrier layers 1207 and 1208 are formed from an inorganic insulating material over the surface of the plastic substrates 1201 and 1202 so as to have a film thickness of from 10 nm to 200 nm. This is an $AlO_xN_{1-x}$ (x=from 0.01 atomic % to 20 atomic %) film, a layer formed from silicon nitride which does not contain hydrogen formed by a radio frequency sputtering method using silicon as a target and using nitrogen as a sputtering gas, or a stacked layer structure including either of the two. This inorganic insulating material is precisely formed to be used as a barrier layer against water vapor and an organic gas which penetrate from external environment. The barrier layers are formed to prevent an organic semiconductor material and the microcapsule, which is incorporated with a contrast medium in which reflectivity changes by applying electric field or the charged particle in which reflectivity changes by applying electric field, from deteriorating by water vapor or an organic gas.

This embodiment mode can be freely combined with Embodiment Modes 1 to 8 within the range of enablement.

Embodiment Mode 10

As an example of an electronic device manufactured by applying the present invention, the following devices can be given: a digital camera; a sound reproducing device such as a car audio; a personal computer; a game machine; a personal digital assistant (cellular phone, portable gaming machine, or the like); an image reproducing device provided with a recording medium such as a home video game machine; and the like. A specific example of these electronic devices is shown in FIGS. 13A to 14C.

Figure 13A:
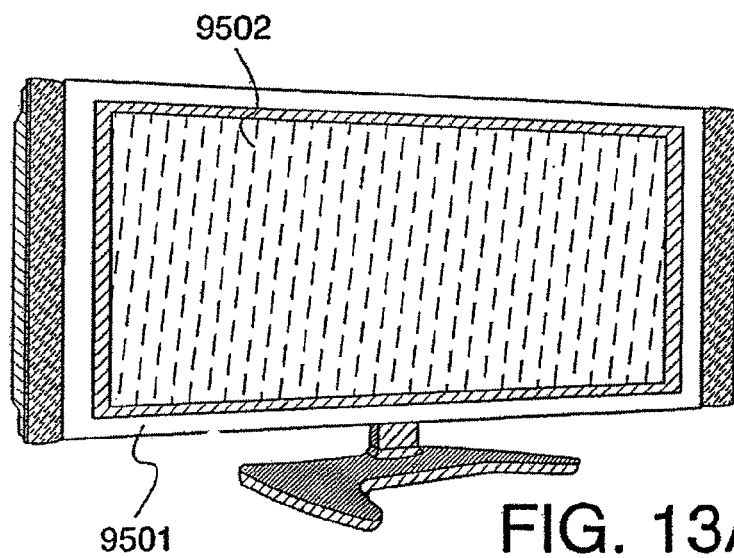
FIGS. 13A to 13C are electronic devices each provided with a semiconductor device according to the invention.
Figure 13B:
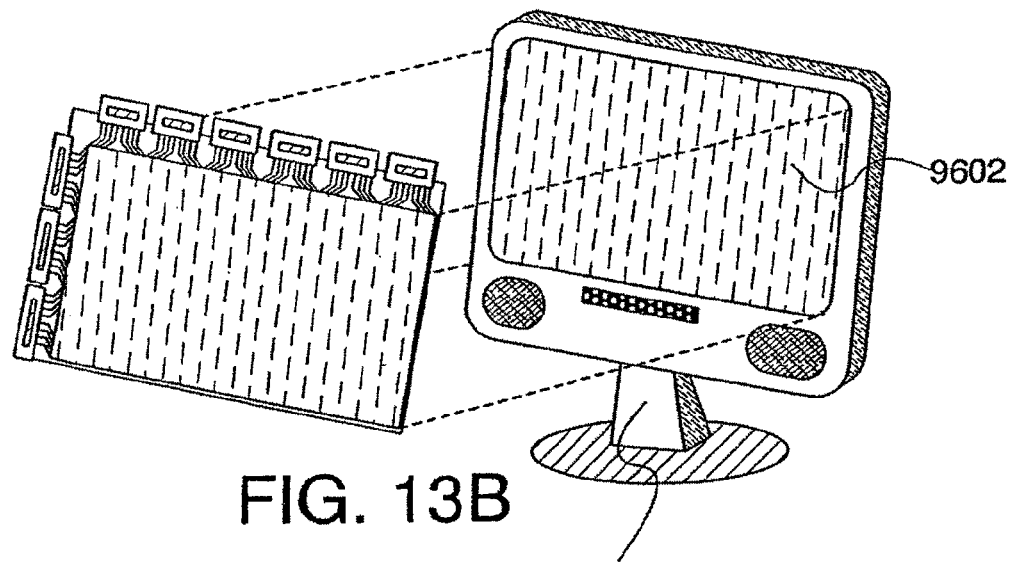
Figure 13C:
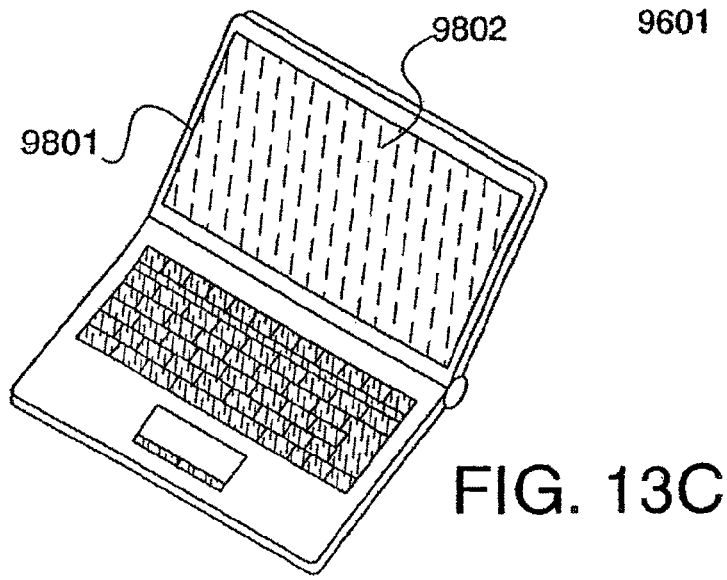

FIG. 13A shows a TV set, which includes a chassis 9501, a display portion 9502, and the like. FIG. 13B shows a monitor for a personal computer, which includes a chassis 9601, a display portion 9602, and the like. FIG. 13C shows a personal computer, which includes a chassis 9801, a display portion 9802, and the like. The invention is applied to the manufacturing of a display portion of the above electronic device. An organic TFT according to the invention is hardly deteriorated and is high reliable; therefore, a display device in which a display is hardly deteriorated can be provided. In addition, the organic TFT according to the invention can be formed from an inexpensive organic material, and an expensive vacuum machine is not required to be used in a manufacturing step by utilizing a printing method or a droplet discharge method; therefore, these electronic devices can be inexpensively manufactured.

Figure 14A:
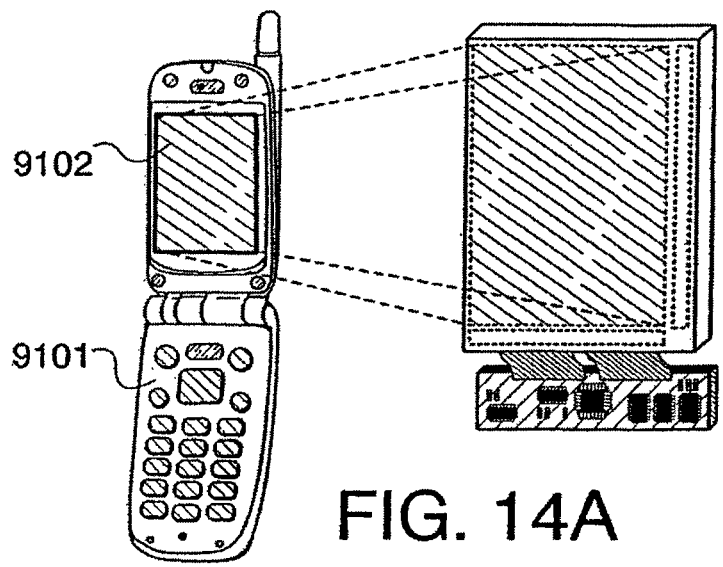
FIGS. 14A to 14C are electronic devices each provided with a semiconductor device according to the invention.
Figure 14B:
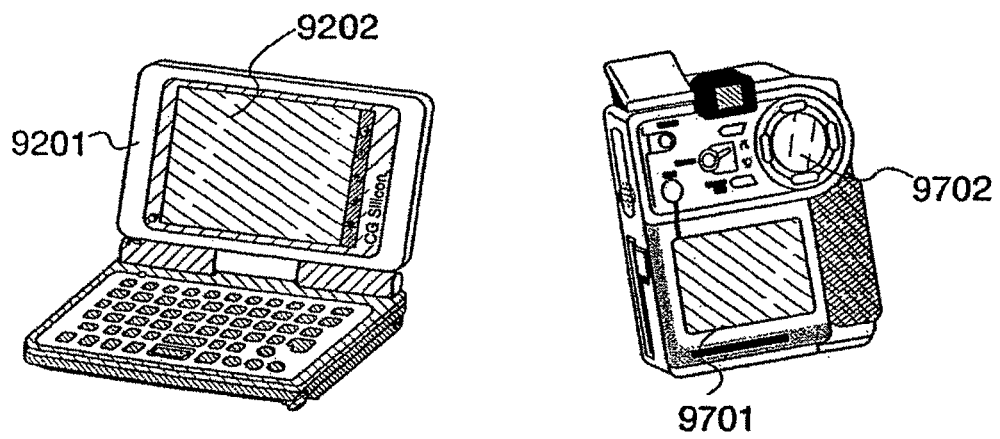
Figure 14C:
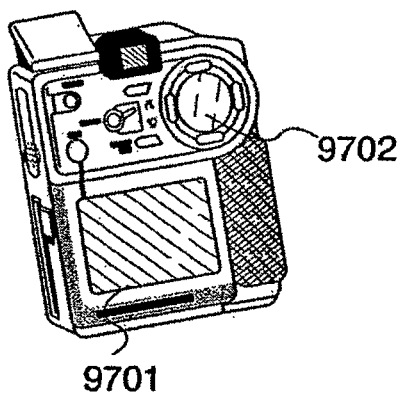

FIG. 14A shows a cellular phone among portable terminals, which includes a chassis 9101, a display portion 9102, and the like. FIG. 14B is a PDA among portable terminals, which includes a chassis 9201, a display portion 9202, and the like. FIG. 14C shows a video camera, which includes display portions 9701 and 9702, and the like. The invention is applied to the manufacturing of a display portion of the above electronic device. An organic TFT according to the invention is hardly deteriorated and is high reliable; therefore, a display device in which a display is hardly deteriorated can be provided. The above electronic devices are portable terminals; therefore, the screen thereof is comparatively miniaturized. Hence, it is preferable to attain miniaturization by mounting a driver circuit and a functional circuit such as a CPU using a thin film transistor in which a polycrystalline semiconductor is used as a channel, and a multilayer wiring over the same substrate as the display portion. The organic TFT according to the invention can be formed from an inexpensive organic material, and an expensive vacuum machine is not required to be used in a manufacturing step by utilizing a printing method or a droplet discharge method; therefore, these electronic devices can be inexpensively manufactured. Further, the above electronic devices are portable terminals; therefore, a display portion using a light emitting element may be used in order to add value in respect of thinning, lightweight, and miniaturization. This embodiment mode can be freely combined with the above embodiment modes within the range of enablement.

This application is based on Japanese Patent Application serial No. 2004-251926 filed in Japan Patent Office on Aug. 31, 2004, the contents of which are hereby incorporated by reference.

What is claimed is:

1. A display device comprising:
   a first flexible substrate;
   a second flexible substrate;

an organic TFT between the first flexible substrate and the second flexible substrate;
a pixel electrode electrically connected to the organic TFT;
a common electrode; and
a microcapsule including a charged particle between the pixel electrode and the common electrode,
wherein the organic TFT comprises:
a gate electrode;
a gate insulating film over the gate electrode;
a source electrode and a drain electrode, which are over the gate insulating film;
an organic semiconductor film over the source electrode and the drain electrode; and
a mask including an insulating material over the organic semiconductor film.

2. The display device according to claim 1, wherein an edge of the mask and a side surface of the organic semiconductor film are aligned with each other.

3. The display device according to claim 1, further comprising
an inorganic film over the organic semiconductor film,
wherein the mask is formed over the inorganic film.

4. The display device according to claim 1, wherein the source electrode and the drain electrode are the same material as the gate electrode.

5. The display device according to claim 1, wherein the insulating material includes photosensitive resin material.

6. The display device according to claim 1, wherein the organic semiconductor film includes pentacene.

7. The display device according to claim 1, wherein the first flexible substrate comprises one selected from polyethylene terephthalate (PET), polyethylenenaphthalate (PEN), polyethersulfone (PES), polycarbonate (PC), and polyimide, and
wherein the second flexible substrate comprises one selected from polyethylene terephthalate (PET), polyethylenenaphthalate (PEN), polyethersulfone (PES), polycarbonate (PC), and polyimide.

8. The display device according to claim 1, wherein the gate electrode includes a binder formed from an organic substance.

9. A display device comprising:
a first flexible substrate;
a second flexible substrate;
an organic TFT between the first flexible substrate and the second flexible substrate;
a pixel electrode electrically connected to the organic TFT;
a common electrode; and
a microcapsule including a charged particle between the pixel electrode and the common electrode,
wherein the organic TFT comprises:
a gate electrode;
a gate insulating film over the gate electrode;
an organic semiconductor film over the gate insulating film;
a mask including an insulating material over the organic semiconductor film; and
a source electrode and a drain electrode, which are over the mask.

10. The display device according claim 9, wherein the organic semiconductor film has a tapered shape.

11. The display device according to claim 9, wherein an edge of the mask and a side surface of the organic semiconductor film are aligned with each other.

12. The display device according to claim 9, further comprising
an inorganic film over the organic semiconductor film,
wherein the mask is formed over the inorganic film.

13. The display device according to claim 9, wherein the source electrode and the drain electrode are the same material as the gate electrode.

14. The display device according to claim 9, wherein the insulating material includes photosensitive resin material.

15. The display device according to claim 9, wherein the organic semiconductor film includes pentacene.

16. The display device according to claim 9, wherein the first flexible substrate comprises one selected from polyethylene terephthalate (PET), polyethylenenaphthalate (PEN), polyethersulfone (PES), polycarbonate (PC), and polyimide, and
wherein the second flexible substrate comprises one selected from polyethylene terephthalate (PET), polyethylenenaphthalate (PEN), polyethersulfone (PES), polycarbonate (PC), and polyimide.

17. The display device according to claim 9, wherein the gate electrode includes a binder formed from an organic substance.

18. A display device comprising:
a first flexible substrate;
a second flexible substrate;
an organic TFT between the first flexible substrate and the second flexible substrate;
a pixel electrode electrically connected to the organic TFT;
a common electrode; and
a microcapsule including a charged particle between the pixel electrode and the common electrode,
wherein the organic TFT comprises:
a source electrode and a drain electrode;
an organic semiconductor film over the source electrode and the drain electrode;
a mask including an insulating material over the organic semiconductor film; and
a gate electrode over the mask.

19. The display device according to claim 18, wherein an edge of the mask and a side surface of the organic semiconductor film are aligned with each other.

20. The display device according to claim 18, further comprising
an inorganic film over the organic semiconductor film,
wherein the mask is formed over the inorganic film.

21. The display device according to claim 18, wherein the source electrode and the drain electrode are the same material as the gate electrode.

22. The display device according to claim 18, wherein the insulating material includes photosensitive resin material.

23. The display device according to claim 18, wherein the organic semiconductor film includes pentacene.

24. The display device according to claim 18, wherein the first flexible substrate comprises one selected from polyethylene terephthalate (PET), polyethylenenaphthalate (PEN), polyethersulfone (PES), polycarbonate (PC), and polyimide, and
wherein the second flexible substrate comprises one selected from polyethylene terephthalate (PET), polyethylenenaphthalate (PEN), polyethersulfone (PES), polycarbonate (PC), and polyimide.

25. The display device according to claim 18, wherein the gate electrode includes a binder formed from an organic substance.

26. A display device comprising:
a first flexible substrate;
a second flexible substrate;
an organic TFT between the first flexible substrate and the second flexible substrate;
a pixel electrode electrically connected to the organic TFT;
wherein the organic TFT comprises:
 a gate electrode;
 a gate insulating film adjacent to the gate electrode;
 an organic semiconductor film adjacent to the gate electrode, wherein the organic semiconductor film and the gate electrode overlap with each other; and
 an insulating material over the organic semiconductor film, and
wherein an edge of the insulating material and a side surface of the organic semiconductor film are aligned with each other.

27. The display device according to claim 26, further comprising
an inorganic film over the organic semiconductor film, wherein the insulating material is formed over the inorganic film.

28. The display device according to claim 26, wherein the insulating material includes photosensitive resin material.

29. The display device according to claim 26, wherein the organic semiconductor film includes pentacene.

30. The display device according to claim 26, wherein the first flexible substrate comprises one selected from polyethylene terephthalate (PET), polyethylenenaphthalate (PEN), polyethersulfone (PES), polycarbonate (PC), and polyimide, and
wherein the second flexible substrate comprises one selected from polyethylene terephthalate (PET), polyethylenenaphthalate (PEN), polyethersulfone (PES), polycarbonate (PC), and polyimide.

31. The display device according to claim 26, wherein the gate electrode includes a binder formed from an organic substance.

* * * * *

UNITED STATES PATENT AND TRADEMARK OFFICE
CERTIFICATE OF CORRECTION

| | | |
|---|---|---|
| PATENT NO. | : 8,445,901 B2 | Page 1 of 1 |
| APPLICATION NO. | : 13/463276 | |
| DATED | : May 21, 2013 | |
| INVENTOR(S) | : Shinji Maekawa | |

It is certified that error appears in the above-identified patent and that said Letters Patent is hereby corrected as shown below:

In the Specification:

Col. 3, line 22, "FIGS. 6A and 68" should read "FIGS. 6A and 6B"

Col. 4, line 13, "indium tin oxide (ITO);" should read "indium tin oxide (ITO),"

Col. 4, line 54, "manufacturing high-definition" should read "manufacturing a high-definition"

Col. 5, line 10, "or the like each step" should read "or the like. Each step"

Col. 11, line 9, "FIG. 78" should read "FIG. 7B"

Col. 11, line 30, "method, printing method," should read "method, a printing method,"

Figure 9B:
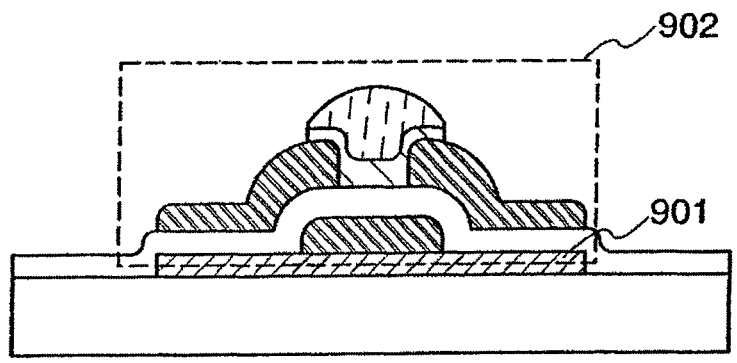

Col. 12, line 11, "shown in FIG. 98" should read "shown in FIG. 9B"

Signed and Sealed this
Third Day of September, 2013

Teresa Stanek Rea
*Acting Director of the United States Patent and Trademark Office*